United States Patent
Terada et al.

(10) Patent No.: US 7,692,955 B2
(45) Date of Patent: Apr. 6, 2010

(54) SEMICONDUCTOR INTEGRATED CIRCUIT

(75) Inventors: Yutaka Terada, Osaka (JP); Satoshi Ishikura, Osaka (JP); Yoshinobu Yamagami, Osaka (JP); Toshio Terano, Osaka (JP)

(73) Assignee: Panasonic Corporation, Osaka (JP)

( * ) Notice: Subject to any disclaimer, the term of this patent is extended or adjusted under 35 U.S.C. 154(b) by 97 days.

(21) Appl. No.: 12/039,585

(22) Filed: Feb. 28, 2008

(65) Prior Publication Data

US 2008/0253171 A1   Oct. 16, 2008

(30) Foreign Application Priority Data

Apr. 12, 2007   (JP)   ............... 2007-104819

(51) Int. Cl.
*G11C 11/00*   (2006.01)
(52) U.S. Cl. ............ 365/154; 365/49; 365/226
(58) Field of Classification Search ............. 365/154, 365/49, 226, 149, 104, 222, 200, 201, 225.7, 365/189.09, 189.11
See application file for complete search history.

(56) References Cited

U.S. PATENT DOCUMENTS

| 4,197,632 | A | 4/1980 | Aomura | |
|---|---|---|---|---|
| 6,313,511 | B1 * | 11/2001 | Noguchi | 257/392 |
| 7,539,042 | B2 * | 5/2009 | Tomita | 365/149 |
| 2003/0001179 | A1 | 1/2003 | Takeuchi | |
| 2005/0132119 | A1 * | 6/2005 | Chan et al. | 711/1 |

* cited by examiner

*Primary Examiner*—Dang T Nguyen
(74) *Attorney, Agent, or Firm*—McDermott Will & Emery LLP

(57) ABSTRACT

A semiconductor integrated circuit includes: a memory cell array including a plurality of SRAM memory cells; a characteristic measuring circuit including a plurality of transistor circuits connected in parallel; and a first terminal. The plurality of transistor circuits each include a first transistor configured in the same manner as one of transistors included in one of the SRAM memory cells. The first transistor is connected so as to control current between the first terminal and a node at a reference potential according to a voltage supplied to a gate of the first transistor.

11 Claims, 5 Drawing Sheets

SEMICONDUCTOR INTEGRATED CIRCUIT

CROSS REFERENCE TO RELATED APPLICATION

This application claims priority under 35 U.S.C. §119 on Patent Application No. 2007-104819 filed in Japan on Apr. 12, 2007, the entire contents of which are hereby incorporated by reference.

BACKGROUND OF THE INVENTION

The present invention relates to a semiconductor integrated circuit incorporating an SRAM (static radon-access memory).

As process rules for semiconductor integrated circuits have shrunk, transistors, mainly MOS (metal oxide semiconductor) transistors, have been decreased in area. This leads to lower cost resulting from a reduction in chip area, and to enhancement in transistor performance, and thus contributes to performance increase not only in LSIs (large-scale integration) alone but also in set equipment typified by mobile devices and other digital products. However, the shrinking process rules have produced adverse effects as well, such as an increase in variation in transistor characteristics. This is because the area occupied by a transistor has become extremely small, and thus variation in the transistor's impurity settings, shape, etc., has increased relatively.

It is known that the magnitude of variation in threshold value, which is one of the transistor characteristics, is proportional to $1/\sqrt{(W \times L)}$ where W is the transistor width and L is the transistor length. That is, as a transistor is reduced in size, variation in the threshold voltage of the transistor is increased. Furthermore, as transistors have been miniaturized, the number of transistors mounted onto a single chip has been increased, causing effects of variation in transistor characteristics to become greater.

The performance of an SRAM memory cell can be indicated by the following three items: static noise margin, which shows the stability of memory data, cell current, which determines the performance at the time of read operation, and write margin, which determines the performance at the time of write operation. In order to ensure operation of an SRAM memory cell, conditions for all of these items must be satisfied. However these items are mutually contradictory, and thus if variation in transistor characteristics is large, it is quite difficult to satisfy conditions for all of these items in the entire variation range. Hence examining the characteristics of transistors on the chip is a step toward circuit improvements and is effective for the satisfaction of the specifications.

Variation roughly contains two kinds of components: a random component and a global component. The random component differs from transistor to transistor. The global component varies from one diffusion process to another and from one slice to another, for example. The random component occurs quite irregularly and is thus very difficult to control. Therefore, in circuit design, variation must be taken into account to keep a certain margin.

On the other hand, the global component gives the same tendency to the entire chip. If the precise value of this component is known, it is possible to effect circuit improvements. To that end, it is effective to measure the tendency of the characteristics of at least a certain number of transistors for each chip rather than measure the characteristics of individual transistors.

For example, Japanese Laid-Open Publication No. 2003-17540 discloses a method in which, mainly for a DRAM (dynamic random-access memory), the characteristics of transistors on a chip are externally evaluated by placing a probe to the source and drain regions of the transistors.

However, in the method disclosed in Japanese Laid-Open Publication No. 2003-17540, probe pads are provided on the chip and the transistor characteristics are measured in the chip fabrication stage. This causes a problem in that the fabrication process becomes complicated, and a region for the probing is separately needed. Furthermore, since the test process using the probe has to be performed before the completion of the chip, a problem in testing also occurs in that another flow is needed which is different from a chip testing process performed after the completion of the chip by using a tester.

SUMMARY OF THE INVENTION

It is therefore an object of the invention to enable, in a semiconductor integrated circuit, estimation of the characteristics of SRAM memory cells included in the semiconductor integrated circuit.

A semiconductor integrated circuit according to the invention includes a memory cell array including a plurality of SRAM memory cells, and a characteristic measuring circuit including a transistor configured in the same manner as one of transistors that form one of the SRAM memory cells.

More specifically, an inventive semiconductor integrated circuit includes: a memory cell array including a plurality of SRAM (static random-access memory) memory cells; a characteristic measuring circuit including a plurality of transistor circuits connected in parallel; and a first terminal, wherein the plurality of transistor circuits each include a first transistor configured in the same manner as one of transistors included in one of the SRAM memory cells; and the first transistor is connected so as to control current between the first terminal and a node at a reference potential according to a voltage supplied to a gate of the first transistor.

According to the inventive circuit, it is possible to precisely estimate the characteristics of the SRAM memory cells by measuring the characteristics of the characteristic measuring circuit including the first transistors from outside the semiconductor integrated circuit through the first terminal. Since the amount of current passing through the first transistor is externally changeable, the measuring device is easily adjustable, which also enables measurement errors to be reduced.

According to the invention, it is possible to estimate the characteristics of the SRAM memory cells, and by performing feedback, such as circuit modification, on the SRAM memory cells in accordance with the estimation results, the operation of the SRAM memory cells is ensured. Since effects of global component of variation in the characteristics are reduced, the performance and yield of the semiconductor integrated circuit including the SRAM are enhanced.

DETAILED DESCRIPTION OF THE INVENTION

Hereinafter, the preferred embodiments of the invention will be described with reference to the accompanying drawings.

Figure 1:
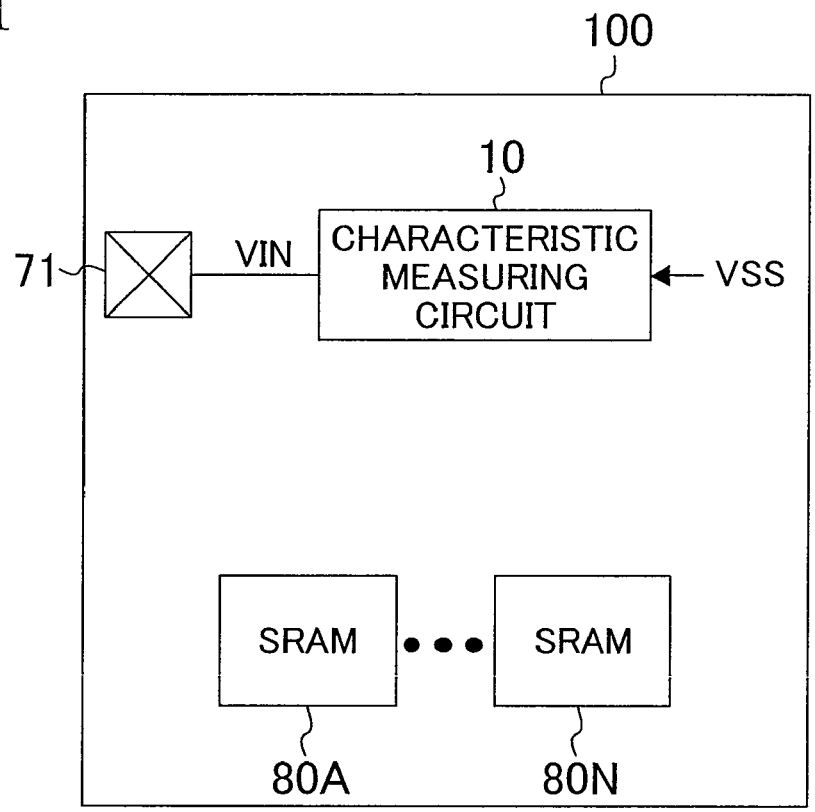
FIG. 1 is a block diagram illustrating the configuration of a semiconductor integrated circuit according to an embodiment of the invention.

FIG. 1 is a block diagram illustrating the configuration of a semiconductor integrated circuit according to an embodiment of the invention. The semiconductor integrated circuit 100 shown in FIG. 1 includes a characteristic measuring circuit 10, a pad 71 as a first terminal, and memory cell arrays 80A, . . . , and 80N. Each of the memory cell arrays 80A, . . . , and 80N includes a plurality of SRAM memory cells.

Figure 2:
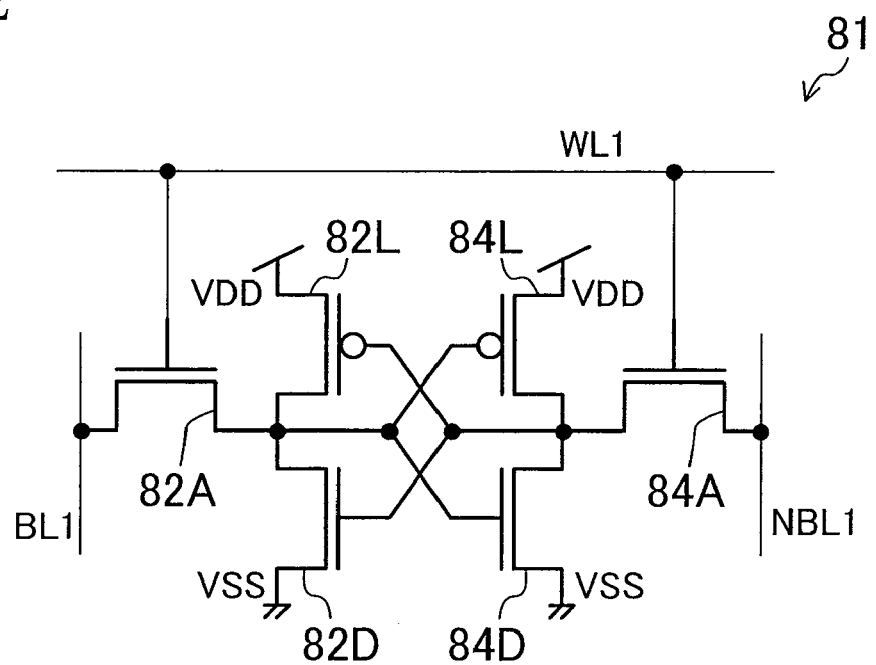
FIG. 2 is a circuit diagram illustrating the configuration of one of the SRAM memory cells included in memory cell arrays shown in FIG. 1.

FIG. 2 is a circuit diagram illustrating the configuration of one of the SRAM memory cells included in the memory cell arrays 80A, . . . , and 80N shown in FIG. 1. The SRAM memory cell 81 shown in FIG. 2 includes access transistors 82A and 84A, drive transistors 82D and 84D, and load transistors 82L and 84L. The access transistors 82A and 84A and the drive transistors 82D and 84D are NMOS (n-channel metal oxide semiconductor) transistors, while the load transistors 82L and 84L are PMOS (p-channel metal oxide semiconductor) transistors.

The gates of the access transistors 82A and 84A are connected to a word line WL1, and the drains of these transistors are connected to complimentary bit lines BL1 and NBL1, respectively, through which memory cell data is transmitted. A ground potential VSS is supplied as a reference potential to the sources of the drive transistors 82D and 84D, while a power supply potential VDD is provided to the sources of the load transistors 82L and 84L. The power supply potential VDD is also supplied as a substrate potential for the transistors 82L and 84L.

Although the performance of the SRAM memory cell 81 is affected by all of the transistors described above, the access transistors 82A and 84A, which are interfaces to outside the memory cell, and the drive transistors 82D and 84D, which produce cell current, particularly have significant effects. In order to make the SRAM memory cell 81 operate stably without any problems when the word line WL1 is activated, it is effective to minimize effects of variations in the characteristics of the access transistors 82A and 84A and of the drive transistors 82D and 84D.

Figure 3:
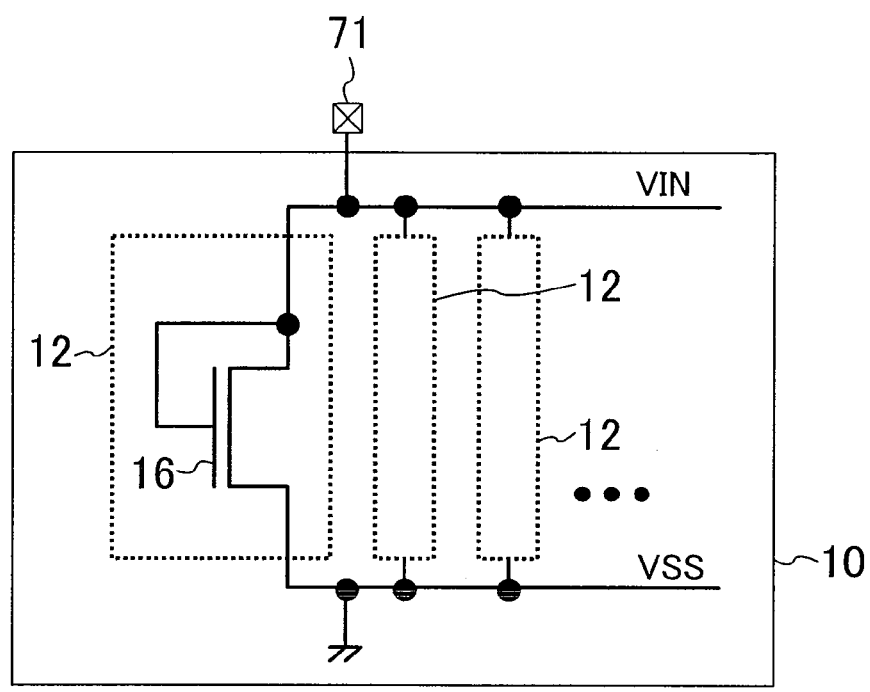
FIG. 3 is a circuit diagram illustrating an example of the configuration of a characteristic measuring circuit shown in FIG. 1.

FIG. 3 is a circuit diagram illustrating an example of the configuration of the characteristic measuring circuit 10 shown in FIG. 1. The characteristic measuring circuit 10 includes a plurality of transistor circuits 12 connected in parallel. Each of the transistor circuits 12 includes a transistor 16.

The transistor 16 shown in FIG. 3 has the same size and shape as the access transistor 82A shown in FIG. 2, and the doped regions, gate, and contact thereof are formed in the same layers as the doped regions, gate, and contact of the access transistor 82A shown in FIG. 2, respectively. The transistor 16 thus has the same characteristics as the access transistor 82A shown in FIG. 2. The ground potential VSS is supplied to the source of the transistor 16, while the drain thereof is connected to the pad 71, from which a voltage VIN is provided. The gate and drain of the transistor 16 are connected with each other (i.e., diode-connected).

At the time of testing, a voltage is applied to the pad 71 from outside the semiconductor integrated circuit 100 shown in FIG. 1. The transistor 16, which is diode-connected, always operates in the saturation region, and a current I1 corresponding to the applied voltage passes through the transistor 16. The value of the current I1 is determined by the characteristics of the transistor 16 and the applied voltage.

It is assumed that the voltage applied to the pad 71 is constant. Then, the value of the current I1 is determined depending on the characteristics of the transistor 16, in other words, depending on the threshold voltage of the transistor 16. Hence the threshold voltage of the transistor 16 is obtainable from the value of the current I1 obtained at this time.

In the characteristic measuring circuit 10 shown in FIG. 1, since the transistor circuits 12 are connected in parallel, the averaged transistor characteristics are obtainable, such that the effects of random variation between transistors are reduced. As a result, the effects of global variation (i.e., variation between chips) alone are obtainable.

The obtained threshold voltage of the transistor 16 shows the characteristics of the access transistor 82A in the SRAM memory cell 81, from which it is possible to estimate the characteristics of the SRAM memory cell 81. According to the estimation results, feedback, such as circuit modification, is performed on the SRAM memory cell 81 in the semiconductor integrated circuit 100 if necessary. This allows the operation of the SRAM memory cell 81 to be ensured.

In the case described in this embodiment, the transistor that is the same as the access transistor 82A is used. However, the access transistor 84A, the drive transistor 82D or 84D, or the load transistor 82L or 84L may be used instead. It is desired that a transistor that will most affect the memory cell characteristics be used.

Figure 4:
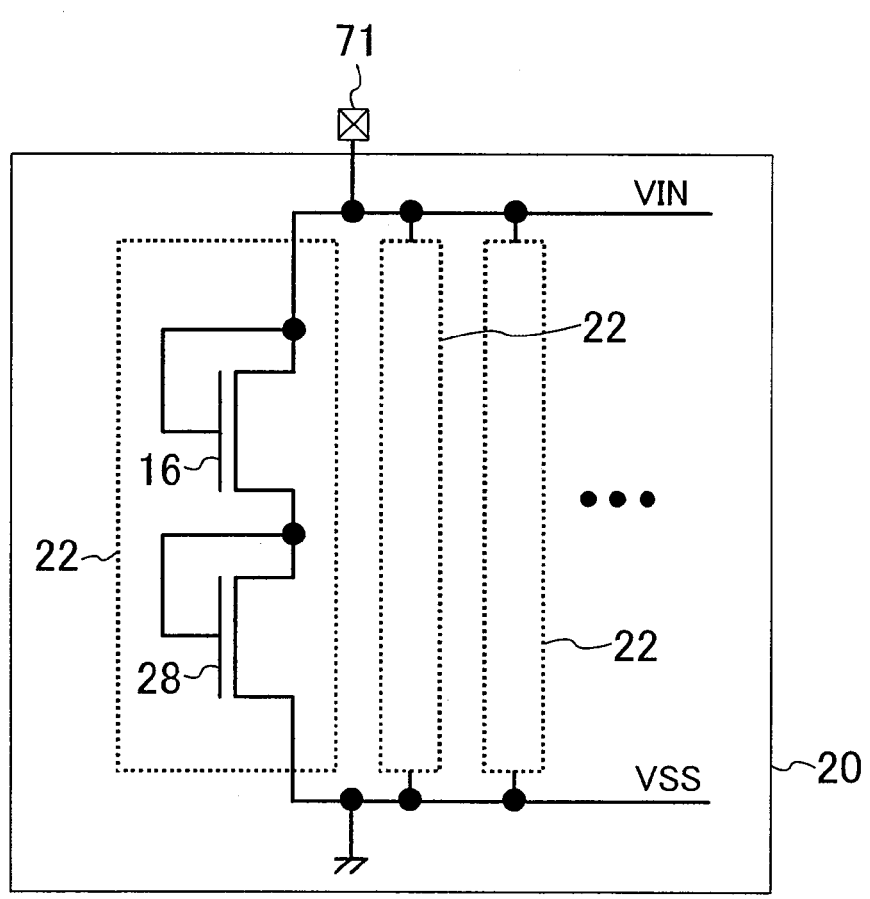
FIG. 4 is a circuit diagram illustrating a configuration for the characteristic measuring circuit shown in FIG. 3 according to a first modified example.

FIG. 4 is a circuit diagram illustrating a configuration for the characteristic measuring circuit 10 shown in FIG. 3 according to a first modified example. A characteristic measuring circuit 20 shown in FIG. 4 includes a plurality of parallel-connected transistor circuits 22. Each of the transistor circuits 22 includes transistors 16 and 28.

The transistor 28 shown in FIG. 4 is the same in size and shape as the access transistor 84A shown in FIG. 2, and the doped regions, gate, and contact thereof are formed in the same layers as the doped regions, gate, and contact of the access transistor 84A shown in FIG. 2, respectively. The transistor 28 thus has the same characteristics as the access transistor 84A shown in FIG. 2. The gate and drain of each of the transistors 16 and 28 are connected to each other (i.e., diode-connected). The transistors 16 and 28 are connected in series.

Figure 5:
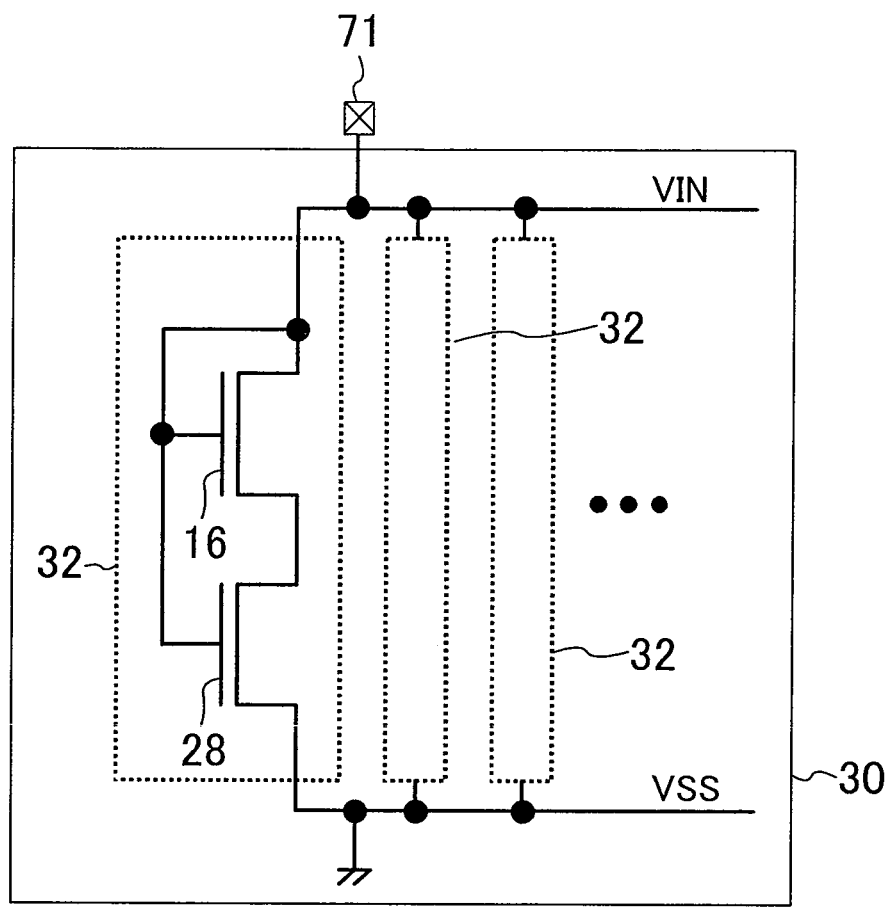
FIG. 5 is a circuit diagram illustrating a configuration for the characteristic measuring circuit shown in FIG. 3 according to a second modified example.

FIG. 5 is a circuit diagram illustrating a configuration for the characteristic measuring circuit 10 shown in FIG. 3 according to a second modified example. A characteristic measuring circuit 30 shown in FIG. 5 includes a plurality of parallel-connected transistor circuits 32. Each of the transistor circuits 32 includes transistors 16 and 28. Each transistor circuit 32 is formed in the same way as the transistor circuits 22 except that the gate of the transistor 28 is connected not to the drain thereof but to the gate of the transistor 16. The characteristic measuring circuit 20 shown in FIG. 4 or the characteristic measuring circuit 30 shown in FIG. 5 is used in the semiconductor integrated circuit 100 shown in FIG. 1 in place of the characteristic measuring circuit 10.

In order to reduce the effects of random variation between transistors, many transistors must be connected in parallel, which, however, increases the amount of current consumption. At the time of testing, an externally supplied constant current is passed through the pad 71, which causes a voltage drop (IR drop) to occur due to the resistive components existing from the pad 71 to the characteristic measuring circuit 10, etc., such that accurate measurement of the current in the transistor 16 or the like that is to be measured may become impossible.

In the characteristic measuring circuits 20 and 30, since the two transistors are connected in series, the on-resistance of the entire circuit is higher than that of the characteristic measuring circuit 10 shown in FIG. 1, and hence the current that passes when a voltage is supplied to the pad 71 is reduced. This allows a more precise measurement of the current passing through the transistors 16 and 28.

In FIGS. 4 and 5, the transistors that are the same as the access transistors 82A and 84A are used as the transistors 16 and 28, but transistors which are the same as the drive transistors 82D and 84D or the load transistors 82L and 84L may also be used.

Alternatively, a transistor which is the same as the access transistor 82A may be used as one of the transistors 16 and 28, and a transistor which is the same as the drive transistor 82D may be used as the other. In that case, the transistors 16 and 28 form a circuit in which the two transistors through which the cell current (read current) of the SRAM memory cell passes are connected in series, and the characteristics of the memory cell are thus reflected more.

Also, in the cases described with reference to FIGS. 4 and 5, the characteristic measuring circuits 20 and 30 include the circuits in each of which two transistors are connected in series. Nevertheless, the characteristic measuring circuits 20 and 30 may include circuits in each of which three or more transistors are connected in series.

Figure 6:
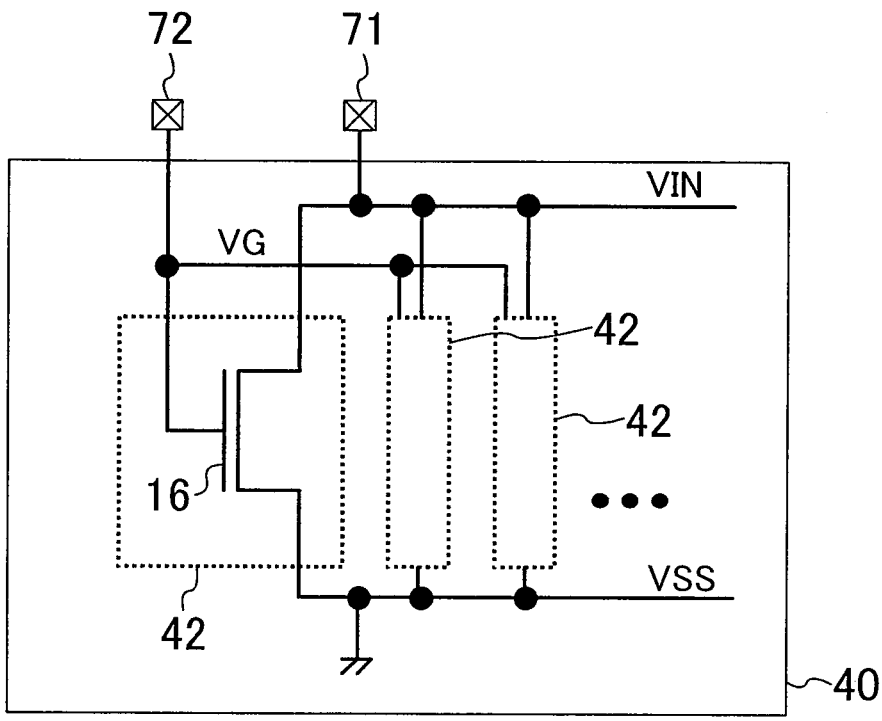
FIG. 6 is a circuit diagram illustrating a configuration for the characteristic measuring circuit shown in FIG. 3 according to a third modified example.

FIG. 6 is a circuit diagram illustrating a configuration for the characteristic measuring circuit 10 shown in FIG. 3 according to a third modified example. A characteristic measuring circuit 40 shown in FIG. 6 includes a plurality of parallel-connected transistor circuits 42. Each of the transistor circuits 42 includes a transistor 16.

Figure 7:
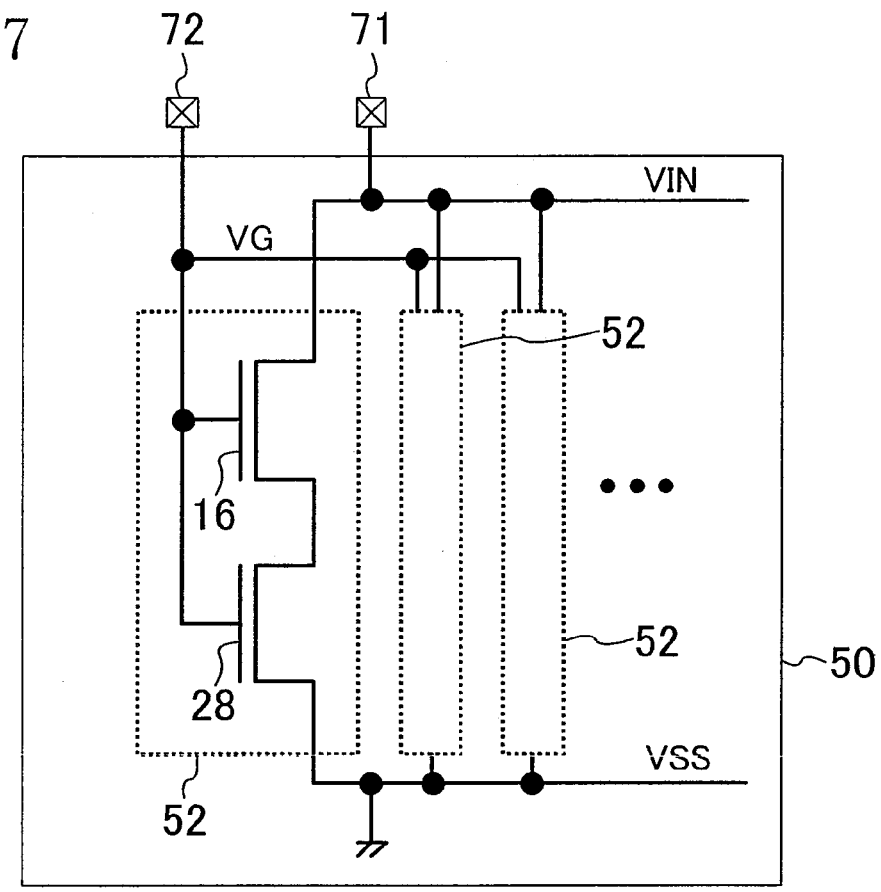
FIG. 7 is a circuit diagram illustrating a configuration for the characteristic measuring circuit shown in FIG. 3 according to a fourth modified example.

FIG. 7 is a circuit diagram illustrating a configuration for the characteristic measuring circuit 10 shown in FIG. 3 according to a fourth modified example. A characteristic measuring circuit 50 shown in FIG. 7 includes a plurality of parallel-connected transistor circuits 52. Each of the transistor circuits 52 includes transistors 16 and 28.

The characteristic measuring circuit 40 shown in FIG. 6 or the characteristic measuring circuit 50 shown in FIG. 7 is used in the semiconductor integrated circuit 100 shown in FIG. 1 in place of the characteristic measuring circuit 10. In that case, the semiconductor integrated circuit 100 further includes a pad 72 as a second terminal. In the transistor circuits 42 and 52, the gate and drain of each transistor 16 are not connected with each other, but the gate of each transistor 16 is connected with the pad 72, from which a control voltage VG is supplied. In the other respects, the transistor circuits 42 and 52 are the same as the transistor circuits 12 shown in FIG. 3 and the transistor circuits 32 shown in FIG. 5, respectively.

When a ground voltage VSS, for example, is supplied to the pad 72 from outside the semiconductor integrated circuit 100 shown in FIG. 1, all of the transistors 16 and 28 in the characteristic measuring circuits 40 and 50 go to the off-state, such that the quiescent current in these circuits becomes measurable. If a voltage fed to the pad 71 is fixed so as to control the voltage supplied to the pad 72, it becomes possible to measure the relation of the drain current with respect to the gate-source voltage in the transistors 16 and the transistor circuits 52, allowing more direct measurements of the threshold voltages of the transistors 16 and the transistor circuits 52.

It should be noted that the semiconductor integrated circuit 100 may be designed so as not to include the pad 72. In that case, the semiconductor integrated circuit 100 may include a circuit for generating the control voltage VG. Alternatively, the ground potential VSS may be supplied as the control voltage VG (for example, in the case shown in FIG. 6, the gate and source of the transistor 16 may also be connected).

In the characteristic measuring circuit 40 shown in FIG. 6, the access transistor 84A, the drive transistor 82D or 84D, or the load transistor 82L or 84L may also be used as the transistor 16.

In the characteristic measuring circuit 50 shown in FIG. 7, transistors which are the same as the drive transistors 82D and 84D or the load transistors 82L and 84L may also be used as the transistors 16 and 28. Alternatively, a transistor which is the same as the access transistor 82A may be used as one of the transistors 16 and 28, and a transistor which is the same as the drive transistor 82D may be used as the other.

Figure 8:
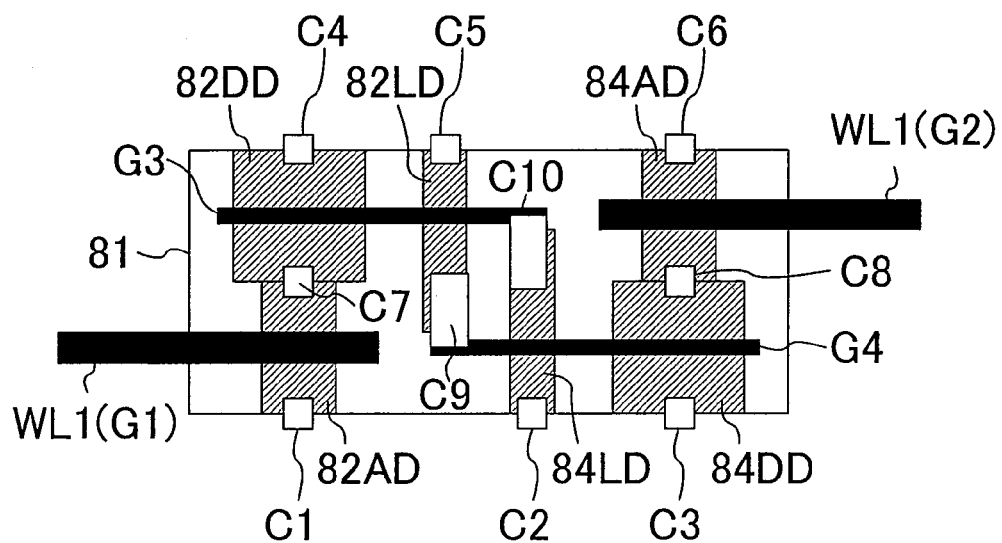
FIG. 8 shows the layout of the SRAM memory cell shown in FIG. 2.
Figure 9:
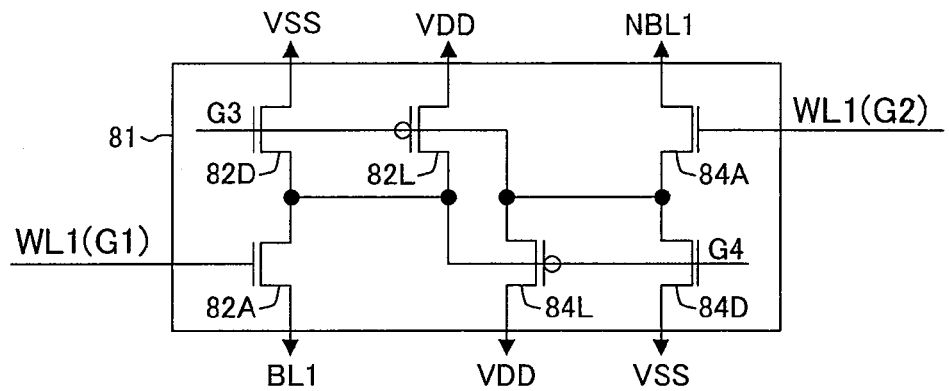
FIG. 9 is a circuit diagram in which the circuit shown in FIG. 2 is rewritten in accordance with the transistor layout shown in FIG. 8.

Next, a description will be made of an example of the actual configuration of the transistor circuits 22 shown in FIG. 4. FIG. 8 shows the layout of the SRAM memory cell 81 shown in FIG. 2. In FIG. 8, only doped regions, gate electrodes, and contacts which are necessary to form the transistors are illustrated, and illustration of wiring layers is omitted. FIG. 9 is a circuit diagram in which the circuit shown in FIG. 2 is rewritten in accordance with the transistor layout shown in FIG. 8.

In FIG. 8, a doped region 82AD and a gate electrode G1 form the transistor 82A, a doped region 82DD and a gate electrode G3 form the transistor 82D, and a doped region 82LD and the gate electrode G3 form the transistor 82L. A doped region 84AD and a gate electrode G2 form the transistor 84A, a doped region 84DD and a gate electrode G4 form the transistor 84D, and a doped region 84LD and the gate electrode G4 form the transistor 84L. Contacts C1 to C10 connect between the transistors.

Figure 10:
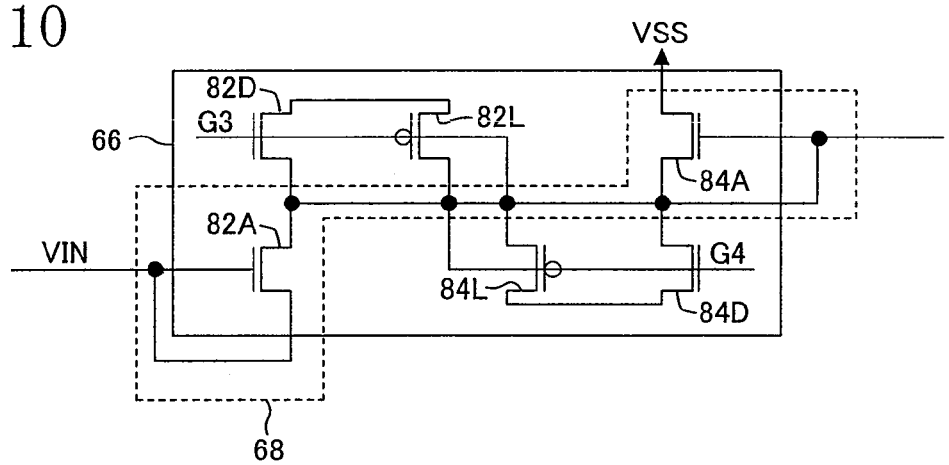
FIG. 10 is a circuit diagram illustrating a cell including a transistor circuit where the configuration for the SRAM memory cell shown in FIG. 8 is used.

FIG. 10 is a circuit diagram illustrating a cell 66 which includes a transistor circuit 68 where the configuration for the SRAM memory cell 81 shown in FIG. 8 is used. In FIG. 10, the doped layers, the gate electrodes, and the contacts shown in FIG. 8 are used as they are, and only the wiring layers are changed from the circuit shown in FIG. 9. To be specific, the transistor 82A and the transistor 84A are connected in series.

The source of the transistor 82D and the source of the transistor 82L are connected with each other, and the source of the transistor 84D and the source of the transistor 84L are connected with each other, so that these unused transistors will not affect the current path. The transistor circuit 68 includes the transistors 82A and 84A thus configured, and is used as each transistor circuit 22 shown in FIG. 4.

Figure 11:
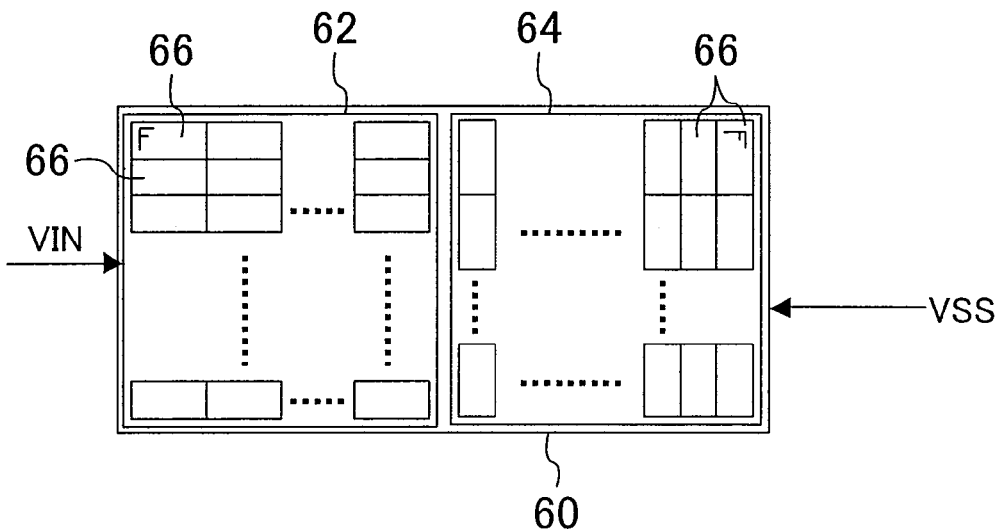
FIG. 11 is a circuit diagram illustrating a configuration for the characteristic measuring circuit shown in FIG. 3 according to a fifth modified example.

FIG. 11 is a circuit diagram illustrating a configuration for the characteristic measuring circuit 10 shown in FIG. 3 according to a fifth modified example. A characteristic measuring circuit 60 shown in FIG. 11 includes circuit blocks 62 and 64. The circuit blocks 62 and 64 both include a plurality of cells 66 which are configured as shown in FIG. 10. The characteristic measuring circuit 60 shown in FIG. 11 is used in the semiconductor integrated circuit 100 shown in FIG. 1 in place of the characteristic measuring circuit 10.

Variation in the characteristics of a transistor is affected by the direction in which that transistor is disposed. Thus variation in the characteristics of a transistor disposed in a direction (e.g., disposed vertically) may be different from variation in the characteristics of a transistor disposed at a 90° angle to that direction (e.g., disposed horizontally). A semiconductor integrated circuit including an SRAM often has a plurality of SRAM blocks disposed on the chip. And in most cases, blocks in which transistors are disposed vertically and blocks in which transistors are disposed horizontally are mixed. In view of this, the characteristic measuring circuit 60 shown in FIG. 11 has the two circuit blocks 62 and 64, thereby reducing effects of variation in characteristics caused by the directions in which transistors are disposed.

To be specific, in the circuit block 62, all of the cells 66 are disposed in the same direction, and the transistor circuits 68 in those cells 66 are connected in parallel. Likewise, in the circuit block 64, all of the cells 66 are disposed in the same direction, and the transistor circuits 68 in those cells 66 are connected in parallel. It should however be noted that the direction in which the cells 66 in the circuit block 64 are disposed is rotated almost 90° with respect to the direction in which the cells 66 in the circuit block 62 are disposed.

That is, the direction of the transistor circuits 68 in the circuit block 62 and the direction of the transistor circuits 68 in the circuit block 64 differ by about 90°. The transistor circuits 68 in the circuit block 62 and the transistor circuits 68 in the circuit block 64 are connected in parallel.

In a semiconductor integrated circuit, different kinds of transistors having different threshold voltages are often properly used depending on the purposes, and in some cases such different kinds of transistors having different threshold voltages are mounted together on the same chip. There is also a case in which a plurality of SRAM memory cells are formed of such different types of transistors.

In that case, since variation in transistor characteristics differs from one transistor type to another, the characteristic measuring circuit 10 or the like may be provided for each transistor type having a different threshold voltage. And each characteristic measuring circuit 10 or the like is designed so as to include transistors that are of a type corresponding to that characteristic measuring circuit 10 or the like.

Likewise, a semiconductor integrated circuit which has therein a circuit other than an SRAM may be designed so as to include a characteristic measuring circuit having transistors included in that circuit other than the SRAM.

As described above, the invention enables estimation of SRAM memory cell characteristics and is thus applicable to a semiconductor integrated circuit incorporating an SRAM, and the like.

What is claimed is:

1. A semiconductor integrated circuit comprising:
a memory cell array including a plurality of SRAM (static random-access memory) memory cells;
a characteristic measuring circuit including a plurality of transistor circuits connected in parallel; and
a first terminal,
wherein the plurality of transistor circuits each include a first transistor configured in the same manner as one of transistors included in one of the SRAM memory cells;
the first transistor is connected so as to control current between the first terminal and a node at a reference potential according to a voltage supplied to a gate of the first transistor; and
the gate of the first transistor is connected with a drain or a source thereof.

2. The circuit of claim 1, wherein the first transistor is configured in the same manner as one of an access transistor and a drive transistor included in the one of the SRAM memory cells.

3. The circuit of claim 1 further comprising a second terminal, wherein the gate of the first transistor is connected with the second terminal.

4. The circuit of claim 1, wherein the plurality of transistor circuits each further include a second transistor which is configured in the same manner as another one of the transistors included in the one of the SRAM memory cells and which is connected in series with the first transistor; and
the second transistor controls the current between the first terminal and the node at the reference potential according to a voltage supplied to a gate of the second transistor.

5. The circuit of claim 4, wherein the first and second transistors are configured in the same manner as an access transistor and a drive transistor, respectively, included in the one of the SRAM memory cells.

6. The circuit of claim 4, wherein the gate of the first transistor is connected with a drain thereof; and
the gate of the second transistor is connected with a drain thereof.

7. The circuit of claim 4, wherein the gates of the first and second transistors are connected with a drain of the first transistor.

8. The circuit of claim 4, wherein the reference potential is supplied to the gates of the first and second transistors.

9. The circuit of claim 4 further comprising a second terminal,
wherein the gates of the first and second transistors are connected with the second terminal.

10. The circuit of claim 1, wherein some of the plurality of transistor circuits belong to a first circuit block, others of the plurality of transistor circuits belong to a second circuit block, and a direction in which the transistor circuits belonging to the first circuit block are disposed and a direction in which the transistor circuits belonging to the second circuit block are disposed differ from each other by about 90 degrees.

11. The circuit of claim 1 comprising a plurality of said characteristic measuring circuits each used for one of different types of transistors having different threshold voltages,
wherein the plurality of SRAM memory cells are formed of the different types of transistors; and
the plurality of characteristic measuring circuits each include, as the first transistors, transistors that are of a type corresponding to that characteristic measuring circuit.

* * * * *